(12) United States Patent
Linkewitsch et al.

(10) Patent No.: US 10,700,692 B2
(45) Date of Patent: Jun. 30, 2020

(54) PROCESSING CIRCUITRY COMPRISING A CURRENT-COMPENSATION UNIT

(71) Applicant: SOCIONEXT INC., Yokohama-shi, Kanagawa (JP)

(72) Inventors: Niklas Linkewitsch, Braunschweig (DE); Guido Dröge, Braunschweig (DE); Charles Joseph Dedic, London (GB)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 16/244,007

(22) Filed: Jan. 9, 2019

(65) Prior Publication Data

US 2019/0229741 A1    Jul. 25, 2019

(30) Foreign Application Priority Data

Jan. 19, 2018  (EP) ..................................... 18152587

(51) Int. Cl.
| | |
|---|---|
| *H03M 1/06* | (2006.01) |
| *H03M 1/08* | (2006.01) |
| *H03M 1/46* | (2006.01) |
| *H03M 1/80* | (2006.01) |
| *H03M 1/40* | (2006.01) |

(52) U.S. Cl.
CPC ....... *H03M 1/0612* (2013.01); *H03M 1/0678* (2013.01); *H03M 1/0863* (2013.01); *H03M 1/462* (2013.01); *H03M 1/403* (2013.01); *H03M 1/804* (2013.01)

(58) Field of Classification Search
CPC .................................................. H03M 1/0612
USPC .......................... 341/118, 120, 144, 155, 161
See application file for complete search history.

(56) References Cited

U.S. PATENT DOCUMENTS

| | | | |
|---|---|---|---|
| 5,319,370 A | 6/1994 | Signore et al. | |
| 7,193,552 B2* | 3/2007 | Mallinson | H03M 1/367 341/155 |
| 8,390,493 B1* | 3/2013 | Raghavan | H03M 1/00 324/95 |
| 8,570,206 B1 | 10/2013 | Lin | |

(Continued)

OTHER PUBLICATIONS

Partial European Search Report, European Patent Application No. 18152587.4, dated Jun. 26, 2018.

(Continued)

*Primary Examiner* — Peguy Jean Pierre
(74) *Attorney, Agent, or Firm* — Arent Fox LLP

(57) ABSTRACT

Processing circuitry comprising: a reference node for connection to a reference voltage source so as to establish a local reference voltage signal at the reference node; a signal processing unit connected to the reference node and operable to process an input signal using the local reference voltage signal, wherein the signal processing unit is configured to draw a current from the reference node at least a portion of which is dependent on the input signal; and a current-compensation unit connected to the reference node and operable to apply a compensation current to the reference node, wherein the current-compensation unit is configured, based on an indicator signal indicative of the input signal and/or of the operation of the signal processing unit, to control the compensation current to at least partly compensate for changes in the current drawn from the reference node by the signal processing unit due to the input signal.

16 Claims, 4 Drawing Sheets

(56) References Cited

U.S. PATENT DOCUMENTS

| | | |
|---|---|---|
| 9,223,332 B1 | 12/2015 | Himmelbauer et al. |
| 2016/0056833 A1 | 2/2016 | Mirhaj et al. |
| 2017/0111052 A1 | 4/2017 | Liu et al. |

OTHER PUBLICATIONS

Elumalai, I., et al., "A Capacitance-Based Reference Scheme for a 14b-Linear, 100 MS/s SAR-Assisted Pipeline ADC", Aug. 21, 2012.

* cited by examiner

PROCESSING CIRCUITRY COMPRISING A CURRENT-COMPENSATION UNIT

CROSS-REFERENCE TO RELATED APPLICATION

This application claims priority from European Patent Application No 18152587.4 filed Jan. 19, 2018. The entire contents of the prior application are incorporated herein by reference.

The present invention relates to processing circuitry and methods. Embodiments may be provided, for example, as (or as part of) an integrated circuit.

Processors of such processing circuitry, which for example process an input signal, suffer from so-called data-dependent errors. That is, the result of processing the input signal (e.g. an output signal) may suffer from errors dependent on the values of the input signal. An example such a processor or processing unit is a digital-to-analogue converter (DAC), which processes an input digital signal and generates an output analogue signal dependent on the input digital signal. Such a DAC may be employed in a successive-approximation-register (SAR) analogue-to-digital converter (ADC) for example.

It is desirable to address such problems.

According to an embodiment of an aspect there is provided processing circuitry comprising: a reference node for connection to a reference voltage source so as to establish a local reference voltage signal at the reference node; a signal processing unit connected to the reference node and operable to process an input signal using the local reference voltage signal, wherein the signal processing unit is configured to draw a current from the reference node at least a portion of which is dependent on the input signal; and a current-compensation unit connected to the reference node and operable to apply a compensation current to the reference node, wherein the current-compensation unit is configured, based on an indicator signal indicative of the input signal and/or of the operation of the signal processing unit, to control the compensation current to at least partly compensate for changes in the current drawn from the reference node by the signal processing unit due to the input signal.

Accordingly, variances in the current drawn from the reference node by the signal processing unit (due to the input signal) may be compensated for by a compensation current drawn from the reference node by the current-compensation unit. That is, if the current drawn from the reference node by the signal processing unit varies due to the input signal, then the compensation current applied to the reference node by the current-compensation unit will also vary so that the variance is at least partially accounted or compensated for by the compensation current. The effects of data-dependent errors (i.e. errors due to current variance on the reference signal at the processing circuitry due to the input signal) may therefore be reduced.

It may be preferable for the current-compensation unit to be configured, based on the indicator signal, to control the compensation current to at least partly regulate the total current drawn from the reference node by the signal processing unit and the current-compensation unit. That is, the compensation current may be applied to the reference node so that at least a part of the total current drawn from the reference node by the signal processing unit and the current-compensation unit is relatively constant. For example, if the current drawn from the reference node by the signal processing unit reduces due to the value of the input signal, the compensation current drawn from the reference node by the current-compensation unit may increase so that the total current drawn from the reference node by the two units is substantially unchanged (as regards currents associated with the input signal).

The current-compensation unit may be operable to draw the compensation current from, or supply the compensation current to, the reference node. Application of the compensation current to the reference node may therefore comprise drawing current from the reference node or supplying current to the reference node, and may further comprise a combination of current drawing and supplying.

In a preferred embodiment, the processing circuitry may comprise signal-generation circuitry operable to generate the indicator signal based on the input signal and/or the operation of the signal processing unit. The signal-generation circuitry may therefore be associated with or communicably connected to the signal processing unit so that the signal-generation circuitry is capable of generating an appropriate indicator signal.

The current-compensation unit may comprise: one or more capacitors; and control circuitry operable, in each of a series of operations, to selectively control connection of the capacitors to the reference node so as to control the compensation current. The one or more capacitors and the selective connection of the capacitors to the reference node may therefore, at least in part, determine the compensation current applied to the reference node. For example, a larger number of capacitors connected to the reference node may cause a larger compensation current to be drawn from or supplied to the reference node, depending on the state of the capacitors (charged/discharged) when so connected.

The control circuitry may preferably be operable to refer to a look-up table based on the indicator signal to determine which, if any, of the capacitors to selectively connect to the reference node. That is, the look-up table may indicate which of the one or more capacitors to connect to the reference node for a given indicator signal (e.g. indicator-signal value).

The current-compensation unit may further comprise a resistor connected between the reference node and the one or more capacitors to limit a peak value of the compensation current applied to the reference node. Furthermore, the control circuitry of the current-compensation unit may, in each of the series of operations, charge or discharge those capacitors to be connected to the reference node before connecting them to the reference node.

In a preferred embodiment, the indicator signal is a digital signal whose values are multibit values; and the control circuitry is operable to control the compensation current based on particular bits of the multibit values. It is therefore possible that only certain bits of the multibit values, rather than all bits of the multibit values, are used to control the compensation current. Similarly, the multibit values may be generated bit-by-bit; and the control circuitry may be operable to control the compensation current based on particular bits of the digital signal as they are generated. It may therefore not be necessary for the control circuitry to receive all bits of the indicator signal, or even for all bits to have been generated, before performing appropriate control of the compensation current. Thus the compensation current may be applied to the reference node more quickly.

It may be preferable for the multibit values to be generated by: hard-wired logic; or constant look-up tables stored in non-volatile memory, or configurable look-up tables stored in volatile memory. The non-volatile memory may, for example, be ROM and the volatile memory may, for example, be RAM.

In preferred embodiments a portion of the current drawn from the reference node by the signal processing unit may be a deterministic current associated with the signal processing unit and independent of the input signal. That is, the deterministic current is a portion of current drawn from the reference node by the signal processing unit which does not vary according to the value of the input signal.

The signal processing unit may comprise: an analogue-to-digital converter; or a digital-to-analogue converter; or a digital-to-analogue converter of a SAR analogue-to-digital converter; or a mixed-signal processing unit; or an interleaved analogue-to-digital converter or a pipelined analogue-to-digital converter. The signal processing unit may therefore be any kind of appropriate signal processing unit, such as a converter.

It may be considered that the signal processing unit and the current-compensation unit are a unit pair, and that the processing circuitry comprises a plurality of the unit pairs connected to a corresponding plurality of said reference nodes. Furthermore, the said plurality of reference nodes may be connected to a shared reference node via a distribution network.

The signal processing units of the unit pairs may preferably be configured to carry out corresponding operations in a time-staggered relationship relative to one another or at the same time as one another.

It may be preferable for the current-compensation unit to be configured, based on the indicator signal, to control the compensation current only when the input signal or the indicator signal is within a given range of values.

According to an embodiment of a second aspect there is provided a current-compensation unit for connection to a reference node along with a signal processing unit, wherein the reference node is for connection to a reference voltage source so as to establish a local reference voltage signal at the reference node, and wherein the signal processing unit when connected to the reference node is operable to process an input signal using the local reference voltage signal, and to draw a current from the reference node at least a portion of which is dependent on the input signal, the current-compensation unit comprising: an input unit operable to receive an indicator signal indicative of the input signal and/or of the operation of the signal processing unit; and an output unit for connection to the reference node and operable to apply a compensation current to the reference node, wherein the current-compensation unit is configured, based on the indicator signal, to control the compensation current to at least partly compensate for changes in the current drawn from the reference node by the signal processing unit due to the input signal.

Embodiments of the present invention therefore extend to a current-compensation unit and processing circuitry comprising a current-compensation unit. Features of the first aspect apply to the second aspect mutatis mutandis, and vice versa.

According to an embodiment of another aspect there is provided an integrated circuit comprising processing circuitry or a current-compensation unit according to the above aspects of the present invention. The integrated circuit may, for example, be a system-on-chip (SOC) circuit.

The present invention extends to method aspects corresponding to the apparatus aspects.

Reference will now be made, by way of example only, to the accompanying drawings, of which:

Figure 1:
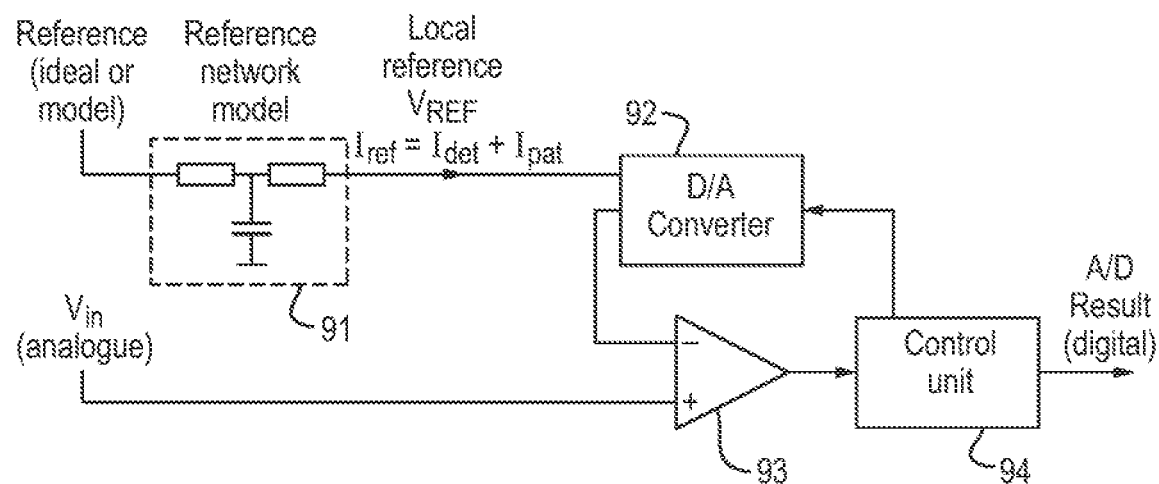
FIG. 1 is a comparable example of a processing circuit known in the art.

FIG. 1 is a comparable example of a processing circuit known in the art, in this case a SAR ADC. The SAR ADC comprises a reference network model 91 (representative of a distribution network carrying a voltage reference signal from an ideal reference source), a digital-to-analogue converter (DAC) 92, a comparator 93 and a control unit 94.

In a real implementation, a parasitic on-chip distribution network represented by reference network model 91 may connect the reference voltage source with one or multiple DAC instances of the signal processing unit (the SAR ADC). While the reference source itself can be considered 'ideal' or 'non-ideal', the local reference is always 'non-ideal'. This means that a varying current will produce varying local voltages. The particular type of reference source is not critical here, where focus is instead placed on the local reference voltage signal established at the DAC 92.

In the SAR ADC shown in FIG. 1, an input signal Vin is compared with an internally generated voltage at the comparator 93. When converting the analogue input to digital, the input voltage Vin is approximated in serial steps using the DAC 92 of the SAR ADC. The DAC 92 is connected to the reference network model 91 and receives a reference voltage signal VRef, and from which it draws a reference current IRef. The current IRef drawn from the reference source by the DAC 92 comprises a deterministic current Idet and a pattern-dependent current Ipat, as indicated. The current profile produced by the DAC can therefore be represented as Idet+Ipat on the voltage at the reference node input to the DAC 92.

The output of the comparator 93 is connected to the control unit 94, which receives the comparison result. The control unit 94 is a successive-approximation-register (SAR) which supplies an approximate digital code of Vin in serial steps to the DAC 92. The DAC 92 uses the reference voltage VRef to convert the digital code output of the control unit 94, which is representative of Vin, to analogue for comparison with Vin on the next loop.

The DAC 92 draws reference current IRef from the reference network model 91, which comprises the deterministic current Idet and the pattern-dependent current Ipat, as mentioned. The deterministic current is dependent on the operation of the DAC 92 and independent of the input signal Vin, and as is such deterministic in the sense that it is not data-dependent. The pattern-dependent current Ipat in contrast is dependent on the digital codes supplied to the DAC 92 by the control unit 94 (which are dependent on Vin).

Thus, the current drawn by the DAC 92 is, at least partially, dependent on the processed signal Vin. That is, the input signal Vin affects the behaviour of the control unit 94 and thus the conversion required by the DAC 92 using the reference voltage. The DAC 92 may therefore draw a variable amount of current from the reference network model 91.

This means that the current drawn from the reference network model 91 is not constant and is not predictable (deterministic), and may cause the local reference voltage VRef to vary and deviate from its intended value. This may lead to errors in the processing of Vin due to an incorrect reference voltage value, which may even accumulate over time. It may also cause errors in other circuitry that may be connected to the reference network model 91 and using the reference voltage VRef. Furthermore, the variance in the reference voltage may cause the reference node to draw more current from the reference network model 91 which may have a knock-on effect on other circuits using the reference source.

It is therefore desirable to account for the variance in the current drawn from the reference node such that the behaviour at the reference node is predictable and a steady reference voltage may be maintained.

Figure 2:
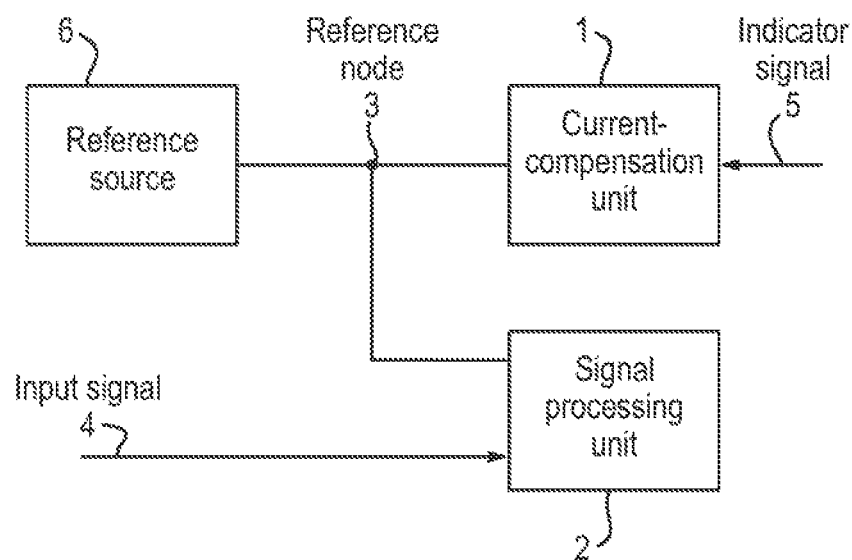
FIG. 2 is a block diagram of processing circuitry according to a general embodiment of an aspect of the invention.

FIG. 2 shows a schematic block diagram representing processing circuitry according to a general embodiment of an aspect of the invention. The signal processing circuitry comprises a current-compensation unit (compensator) 1 connected to a reference node 3, and a signal processing unit (processor or processing unit) 2 which is also connected to the reference node 3. The reference node 3 may further be connected to a reference source 6 which provides a reference signal for establishing a local reference voltage signal at the reference node 3. As before, it is assumed that the reference source 6 is non-ideal.

The signal processing unit 2 processes an input signal 4 using the local reference voltage signal. The current compensation unit 1 receives an indicator signal 5 which is indicative of the input signal 4 and/or of the operation of the signal processing unit 2. The indicator signal 5 may be received as part of the input signal 4, or as a separate signal from the signal processing unit 2 or another part of the circuitry.

The signal processing unit 2 draws a current from the reference node, and the current drawn by the signal processing unit 2 is, at least partially, dependent on the input signal 4 which it is processing. That is, the input signal 4 is processed by the signal processing unit 2 using the local reference voltage signal, and the signal processing unit 2 may draw a variable amount of current from the reference node 3 dependent the value of the input signal 4.

The current compensation unit 1 may draw a current from the reference node 3 and may, additionally or alternatively, supply a current to the reference node 3. The current applied to (drawn from and/or supplied to) the reference node is referred to herein as the compensation current. The compensation current is intended to compensate for the variable amount of current drawn from the reference node 3 by the signal processing unit 2 due to the input signal 4. That is, the compensation current is applied to the reference node 3 so that the sum of the current drawn from the reference node 3 by the signal processing unit 2 and drawn from (and/or supplied to) the reference node 3 by the current compensation unit 1 is less data-dependant than the current drawn from the reference node 3 by the signal processing unit 2 alone. In this context, "less data-dependant" means e.g. that, assuming the same given input signal, the variance on the sum of the current drawn from the reference node 3 is smaller than on just the current drawn from the reference node 3 by the signal processing unit 2.

For example, if the current drawn from the reference node 3 by the signal processing unit 2 decreases due to the input signal, then the current-compensation unit 1 increases the compensation current (where it is drawn from the reference node 3) so as to control the total current drawn from the reference node 3 by the current-compensation unit 1 and the signal processing unit 2 to an extent. More precisely, the compensation current is controlled to at least partly compensate for changes in the current drawn from the reference node 3 by the signal processing unit 2 due to the input signal.

On the other hand, if the current drawn from the reference node 3 by the signal processing unit 2 increases due to the input signal, then the compensation current (where it is drawn from the reference node 3) will be decreased by the current-compensation unit 1 to at least partly compensate for changes in the current drawn from the reference node 3 by the signal processing unit 2 due to the input signal.

The current-compensation unit 1 controls the compensation current on the basis of the indicator signal 5, which is indicative of the input signal 4 and/or of the operation of the signal processing unit 2. It may be considered that the indicator signal 5 is representative, either directly or indirectly, of the current drawn from the reference node 3 by the signal processing unit 2 (or at least of the part of that current Ipat which is input-signal dependent). That is, the indicator signal 5 is able to communicate information to the current-compensation unit 1 which is representative of the input signal and/or of the operation of the signal processing unit, so that the current-compensation unit 1 is able to determine the current drawn from the reference node 3 by the signal processing unit 2 due to the input signal and then control the compensation current accordingly. A constant reference current Iref may therefore be maintained (ignoring for now the deterministic current Idet), regardless of the value of the input signal 4 being processed. Since the current drawn from the reference node 3 may in this way become substantially independent of the input signal, the local reference voltage signal Vref established at the reference node may also become substantially independent of the input signal.

As above, the current Iref drawn from the reference node 3 by the signal processing unit 2 may be categorised into two categories: deterministic current Idet and pattern-dependent current Ipat. The deterministic current Idet is associated with the signal processing unit and is independent of the input signal. The pattern-dependent current is the current drawn from the reference node 3 by the signal processing unit 2 that varies depending on the value of the input signal, and which is compensated for by the compensation current. The different currents in the circuit are indicated in the block diagram of FIG. 3 and discussed in more detail below.

Figure 3:
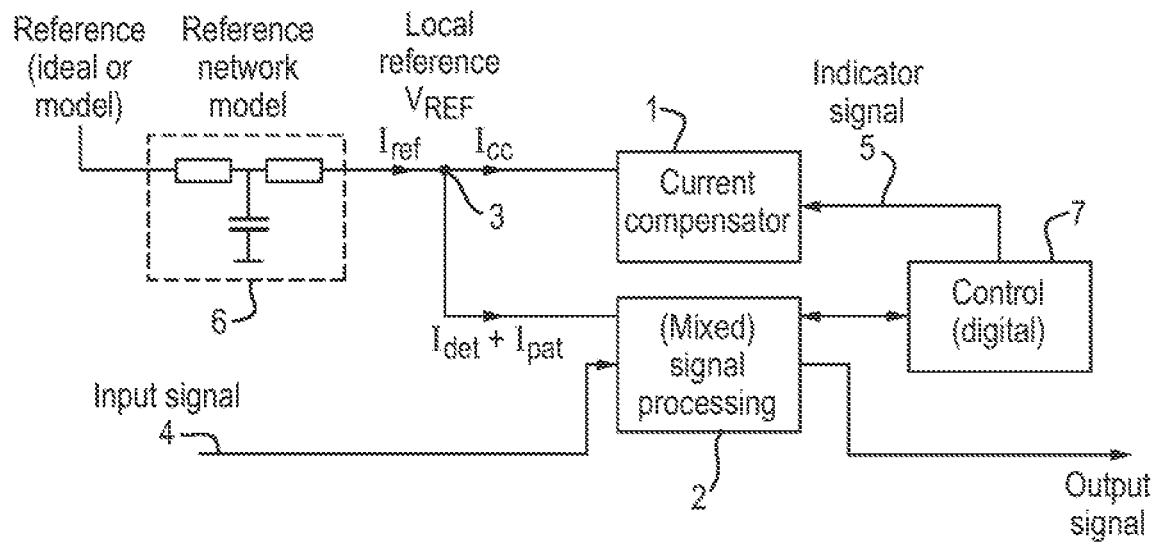
FIG. 3 is a block diagram of processing circuitry according to an embodiment of an aspect of the invention.

FIG. 3 depicts a schematic block diagram of processing circuitry according to an embodiment of an aspect of the invention. Similarly to FIG. 2, the diagram comprises a current-compensation unit 1, a signal processing unit (here, a mixed-signal processing unit such as an ADC or DAC) 2, a reference node 3, an input 4, an indicator signal 5 and a reference source 6 (considered to be the combination of a true reference source—not shown—and the reference network model 6). These elements are connected in the same way as in FIG. 2. The diagram further includes a control unit 7 (for example, a digital control unit), which is connected between the signal processing unit 2 and the current-compensation unit 1, and provides the indicator signal 5 to the current-compensation unit 1.

It should be noted that embodiments of the present invention may be applied to any processing circuitry which processes signals with the aid of a reference voltage, including ADCs and DACs. The current-compensation unit 1 effectively is provided with knowledge of the pattern-dependency (i.e. Input-signal-dependency) of the current drawn by the processing unit 2 such that the current-compensation unit 1 is able to determine the appropriate value of the compensation current to apply to the reference node based on the indicator signal 5 (which itself is based on the input signal).

An example applied to an analogue-to-digital converter including an architecture with successive approximation and that uses capacitive switching will be considered next.

Figure 4:
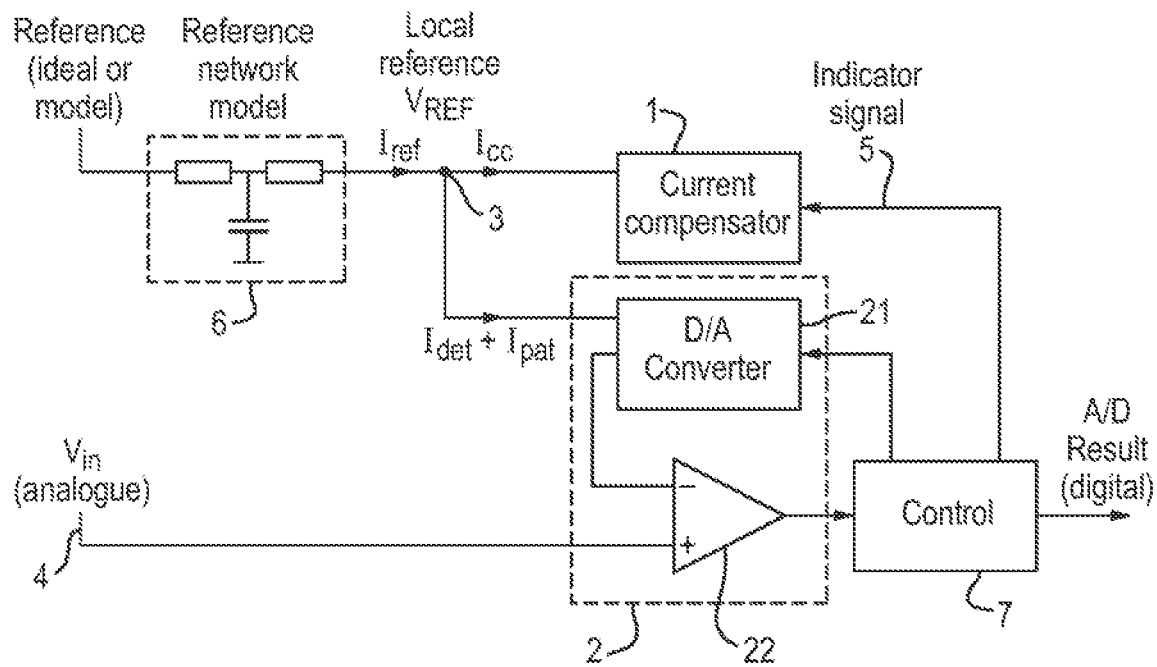
FIG. 4 is a block diagram of processing circuitry according to a detailed embodiment of an aspect of the invention.

FIG. 4 is a schematic block diagram of processing circuitry according to a detailed embodiment of an aspect of the invention, which uses a successive approximation (SAR) based analogue-to-digital converter. The diagram is the same as that of FIG. 3 except the signal processing unit 2 comprises a digital-to-analogue converter (DAC) 21 and a comparator 22. The output of the comparator 22 is connected to the control unit 7 which generates the indicator signal 5, based on the output of the comparator 22 (and thus on the input signal Vin), and supplies it to the current-compensation unit 1. The output of the comparator 22 is also effectively fed back to the DAC 21 (via the control unit 7, and associated processing) for the next iteration of the successive approximation.

As before, the input signal Vin is compared with an internally generated voltage at the comparator 22. When converting the analogue input to digital, the input voltage Vin is approximated by serial steps using the DAC 21 of the SAR. The current profile produced by the DAC comprises deterministic current Idet and pattern-dependent current Ipat, as discussed above. The current profile produced by the DAC can therefore be represented as Idet+Ipat on the voltage at the reference node 3 (Vref in FIG. 4).

The relevant circuit currents shown in FIG. 4 are:
Idet—deterministic current (drawn by the DAC 21)
Ipat—pattern dependant current (drawn by the DAC 21)
Icc—compensation current (applied by the current-compensation unit 1)
Iref—total current (on local reference node 3)

The current Ipat that depends on the pattern produced by the SAR control block 7 (and that depends on the input signal). The deterministic part of the current Idet impacts the gain and offset of the conversion, which may easily be corrected for. However, the undesired and varying (input-signal-dependent) current Ipat creates inter-symbol noise which cannot be cancelled on the system level (i.e. outside the ADC).

The role of the current-compensation unit 1 is thus to compensate for the pattern-dependent current Ipat and, more specifically, for variances in Ipat due to changes in the input signal. It may be that only some (e.g. a major part) of Ipat may be compensated for, or the full amount may be compensated for. For example, it is considered beneficial even if not all of the range of values of the input signal may be compensated for. The compensation may be limited, for example, to the values for Vin which result in the lowest values of Ipat. In some arrangements, the current-compensation unit 1 may only be utilised when the current drawn Ipat from the reference node by the signal processing unit 2 falls below a predetermined level so as to improve the power efficiency of the circuit.

The goal of the compensation, for part of or the whole range of input values, may be represented (in the ideal case) using the following expression:

$$Ipat+Icc=\text{pattern independent}=\text{constant}$$

In this case, all non-deterministic effects (for part of or the whole range of input values) should be eliminated as much as possible. Since the pattern dependency of the current drawn by the DAC 22 in a SAR conversion can be determined in advance, an appropriate value for the compensation current can be determined by look-up (using, for example, a look-up table) or hard wired logic, based on the values of the momentarily produced decision pattern of the control unit 7. Measurement of the voltage or current at the reference node 3 is possible, but not necessary.

In one arrangement, the current compensation may take place 'on-the-fly', i.e. immediately at each of the temporarily processed bits, or at a subset of processed bits which may, for example, belong to one symbol. That is, the indicator signal may be a multibit signal which is generated bit-by-bit, and the current compensation may begin with the early bits without needing to wait for them all. In another arrangement, the current compensation may take place after a full sample has been processed or after a group of bits has been processed, such as, for example a group of bits in a pipelined SAR stage. These approaches are discussed in more detail below.

Figure 5:
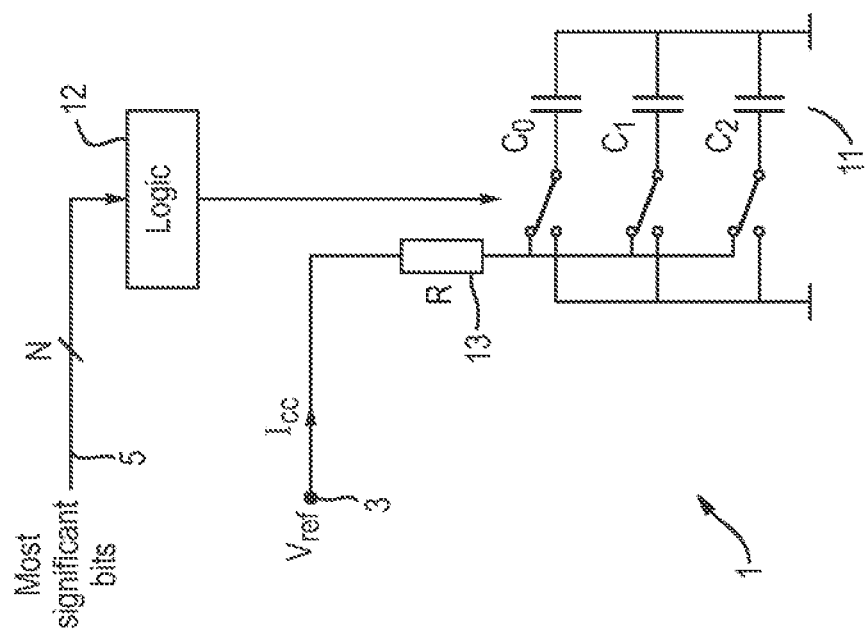
FIG. 5 is a circuit diagram of a current compensation unit and associated look-up tables according to an embodiment of an aspect of the invention.

FIG. 5 shows a schematic circuit diagram of a current compensation unit 1 and associated look-up tables according to an embodiment of an aspect of the invention. For demonstration, it may be assumed that the current compensation unit (compensator) 1 of FIG. 5 is integrated with the SAR ADC shown in FIG. 4. The current-compensation unit 1 shown in FIG. 5 comprises an array of capacitors and switches 11, control circuitry 12 (depicted in FIG. 5 as circuit logic) and a resistor 13. It should be noted that the resistor 13 is an optional element of the current-compensation unit 1, and that, although three capacitors are shown in FIG. 5, any number of capacitors (one or more) may be provided in the current-compensation unit 1.

The array of switches and capacitors 11 are disposed between the reference node and ground. As shown in FIG. 5, each capacitor is provided with a switch which is operable to connect the capacitor to the reference node 3. When the capacitor is connected to the reference node 3 (via the resistor 13) in an uncharged state, current is drawn from the reference node which constitutes (or contributes to) the compensation current Icc. The amount of current (i.e. the compensation current Icc) drawn from the reference node by the current-compensation unit 1 can be increased (or decreased) by connecting more (or fewer) capacitors to the reference node 3.

The capacitors may therefore be controllably connected into circuit to vary the compensation current drawn from the reference node and to compensate for the changing current Ipat drawn from the reference node by the signal processing unit (or, more specifically, the DAC of the signal processing unit). The capacitors may be charged or discharged before being connected to the circuit, so as to control the compensation current.

Capacitors are used in the current-compensation unit of FIG. 5 but any appropriate current sink or array of current sinks that is capable of drawing a controllable amount of current from the reference node may be used. Alternatively to the capacitors in the current-compensation unit 1, the current-compensation unit 1 may comprise one or more current sources/sinks which may apply current to the reference node 3 so as to compensate for changes in the reference current due to the input signal. Furthermore, a mixture of capacitors and current sources/sinks may be provided so as to provide more versatile and accurate regulation of the compensation current.

It is recalled that although the compensation current Icc is shown in FIG. 4 as being drawn from the reference node 3, in another arrangement a compensation current could be arranged to be supplied to the reference node while maintaining Ipat−Icc=pattern independent=constant, and the present disclosure will be understood accordingly.

Returning to FIG. 5, the switches and capacitors are for exemplary purposes only and the ratio of capacitors to switches may vary according to the application and/or the values of the capacitors. For example, one switch may be provided so as to switch multiple capacitors into and out of circuit.

The switches which connect the capacitors to the circuit are controlled by the control circuitry 12. The control circuitry 12 receives the indicator signal 5. The control circuitry 12 selectively switches the one or more switches so as to switch the capacitors into or out of the circuit. The control circuitry 12 may be provided as logic circuitry or any other suitable controller which is capable of selectively switching an array of switches according to the indicator signal 5.

Based on the indicator signal 5, the control circuitry 12 determines which of the capacitors need to be connected into circuit to produce an appropriate compensation current Icc. The control circuitry 12 then accordingly operates the switches so as to connect particular capacitors, which achieve the desired compensation current, to the reference node 3. The remaining capacitors may be (or remain) switched out of circuit so that they do not draw any current from the reference node 3. The indicator signal 5 may be provided as a digital signal with a certain number of bits, which may, for example, be determined by the range of values of the input signal.

The control circuitry may determine which of the capacitors to connect to the reference node based on one or more look-up tables, such as those shown in FIG. 5, which are based on the pattern dependency of the current Ipat drawn by the DAC of the signal processing unit 2. In each table there is a column for the indicator signal (which may be expressed by a plurality of bits, and is the value input to the DAC 21 and is associated with the value of the input signal Vin); a column for the associated switching pattern; and a column (optional, and included here for ease of understanding) for the resulting relative compensation weight it can be seen that the bit value of the indicator signal is read and then the appropriate compensation weight and the required capacitors are determined from the look-up tables. The control circuitry 12 is then operable to switch the associated switches in the array of switches and capacitors so as to connect the determined capacitors to the reference node 3 (in this case, after first discharging them).

Two possible approaches for determination of the compensation current are shown in the tables—symbol based and on-the-fly. In the symbol based approach, four bits of the indicator signal are required before a determination of required capacitor switching is made. In the on-the-fly approach, the determination may be made as the bits are read one-by-one or pair-by-pair into the control circuitry 12. The symbol based approach may therefore be considered to be more accurate, while the on-the-fly approach is quicker. The short-term lack of accuracy associated with the on-the-fly approach is acceptable as errors do not accumulate over time.

When applied to a SAR ADC, the decision bits (indicator signal 5) for the current-compensation unit (the indicator signal) are determined serially, starting with the most significant bit (MSB). The current compensator 1 in the present example works as follows:

At the beginning of the processing of a symbol, the compensation capacitances (here C0, C1 and C2) are discharged.

i) In a 'symbol based' implementation with N=4 (N is the number of bits for the indicator signal 5), the compensation takes place after the four MSBs are known (the indicator signal may have further bits, but the four MSBs may be sufficient). This 4-bit value is looked-up from a table and the specific combination of compensation capacitors is obtained. The control circuitry 12 may then charge the subset of capacitors by switching the relevant switches so that they are connected to reference node 3. This operation draws the relevant compensation current Icc from the Vref reference node 3 (proportional to the charge). The resistor R may be provided between the reference node 3 and capacitors (as shown in FIG. 5) to limit the peak current.

ii) In an example 'on-the-fly' implementation with N=4, one compensation takes place after the first two bits are known. Depending on the bit pattern, the capacitance (capacitor) $C_0$ is charged or not charged. Compensation similarly occurs after the third bit and after the fourth bit are known. Depending on the pattern of the leading three bits (or four bits), the capacitance $C_1$ (or $C_2$) is charged or not charged, as demonstrated in the look-up table in FIG. 5.

The values shown in the look-up tables in FIG. 5 are of course only examples. In practice, the values for the look-up tables may be application based and may, for example, be based on the range of values of the input signal, the number of bits to be read or provided to the current-compensation unit 1, and/or the values of the capacitors (and/or current sources/sinks) in the current-compensation unit 1. If the current-compensation unit 1 is provided with current sources instead of or in combination with the capacitors, then the look-up table will reflect this.

The look-up tables are determined based on the input signal and the associated pattern-dependency of the current. The look-up tables may be pre-stored in the current-compensation unit 1, or in a storage unit with which the current-compensation unit 1 is communicably connected.

It can be seen from the look-up tables of FIG. 5 that, in the present example, the mid-range of values do not require much, if any, compensation. Therefore, as discussed above, the current-compensation unit 1 may only compensate for part of the range of values in order to improve the efficiency of the system. For example, using the representative values shown in the tables of FIG. 5, the current-compensation unit may only cause the control circuitry 12 to switch the array of switches and capacitors when the relative compensation weight is above a predetermined value, such as 2 (i.e. for relative compensation weights 4, 8, 10 and 14).

Figure 6:
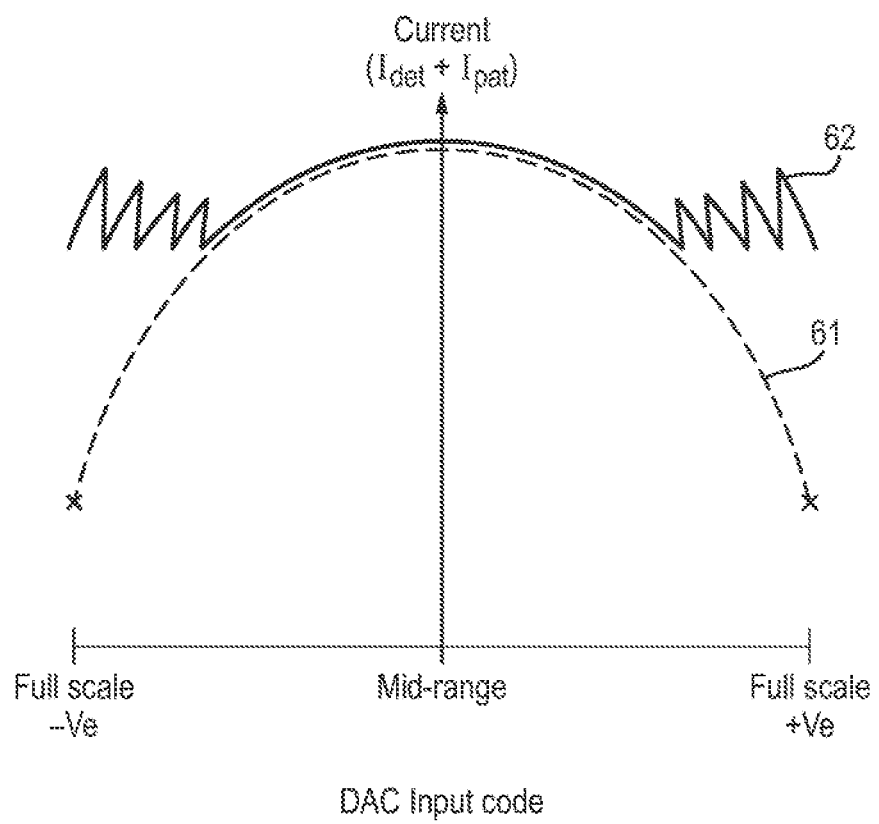
FIG. 6 is a graph depicting the reference current of processing circuitry according to an embodiment of an aspect of the invention.

FIG. 6 is a graph depicting an example reference current Iref of processing circuitry according to an embodiment of an aspect of the invention. The uncompensated current drawn (Ipat+Idet) from a capacitive DAC (C-DAC) in a differential SAR ADC, such as that shown in FIG. 4, commonly has a parabolic pattern dependency. This parabolic curve is shown as curve 61 in FIG. 6. In this graph, a given digital value is plotted on the x-axis and the resulting current is plotted on the y-axis. Furthermore, a constant sample rate is assumed. The look-up tables and compensation capacitances may be designed to match the parabolic curve. An example for a resulting compensated current (Ipat+Idet+Icc) is shown as curve 62 in FIG. 6.

As can be seen from the curve 62 of FIG. 6, the compensated reference current 62 drawn from the reference node 3 is kept (at least approximately) within a range of values which are substantially constant, compared to the non-compensated reference current 61. The reference voltage Vref and the current drawn Iref from the reference source may therefore also be substantially constant (and substantially not data dependent). Data-dependent errors in the processing of the input signal may be reduced and errors in other circuitry connected to the reference source may also be reduced. For example, multiple instances of the processing circuitry disclosed herein could be connected to the same reference node 3.

The range of values of the resulting compensated reference current may vary depending on the application and may, for example, be dependent on the number of bits of the indicator signal used for the determination, the determination method (e.g. on-the-fly vs. symbol approach), the accuracy of the look-up table, and/or the range and incremental steps of the compensation current Icc that may be applied to the reference node 3 by the current-compensation unit 1. For example, a compensator comprising a large array of capacitors of varying values may be able to generate a compensation current that more accurately compensates for the pattern dependency of the input values. It can further be seen from FIG. 6 that the mid-range values of the input pattern may not require compensation.

It will be appreciated that the circuitry disclosed herein could be described as a signal processor or compensator. Circuitry of the present invention may be implemented as integrated circuitry, for example on an IC chip such as flip chip. The present invention extends to integrated circuitry and IC chips as mentioned above, circuit boards comprising such IC chips, and communication networks (for example, Internet fiber-optic networks and wireless networks) and network equipment of such networks, comprising such circuit boards.

Figure 7:
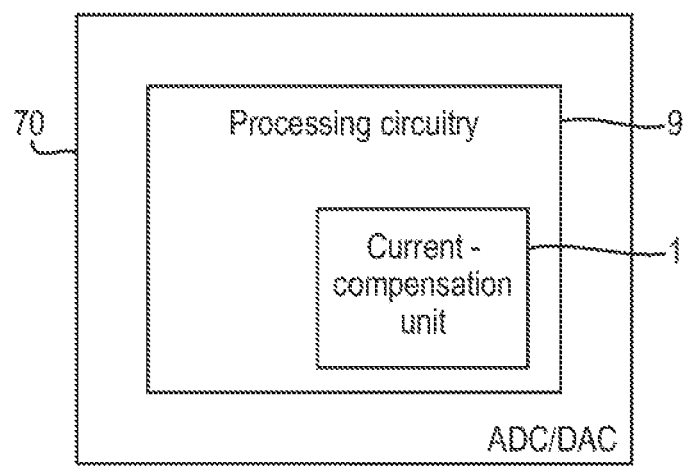
FIG. 7 is a block diagram of a system-on-chip integrated circuit comprising processing circuitry according to an embodiment of an aspect of the invention.

FIG. 7 is a schematic block diagram of an analogue-to-digital converter (ADC) or digital-to-analogue converter (DAC) circuit 70 comprising processing circuitry 9, including a current-compensation unit 1, according to an embodiment of an aspect of the invention. The processing circuitry 9 and current-compensation unit 1 may be provided as part of an ADC or DAC as shown in FIG. 7, or may be provided as part of any integrated circuit, system-on-chip, processor, analogue or digital circuit which utilises a voltage reference signal and draws a pattern-dependent current Ipat therefrom. The processing circuitry 9 may correspond to the processing circuitry of any of FIGS. 2, 3 and 4, for example.

In any of the above aspects, the various features may be implemented in hardware, or as software modules running on one or more processors as appropriate. Features of one aspect may be applied to any of the other aspects.

The invention also provides a computer program or a computer program product for carrying out any of the methods described herein, and a computer readable medium having stored thereon a program for carrying out any of the methods described herein. A computer program embodying the invention may be stored on a computer-readable medium, or it could, for example, be in the form of a signal such as a downloadable data signal provided from an Internet website, or it could be in any other form.

The present invention may be embodied in many different ways in the light of the above disclosure, within the spirit and scope of the appended claims.

The invention claimed is:

1. Processing circuitry comprising:
a reference node for connection to a reference voltage source so as to establish a local reference voltage signal at the reference node;
a signal processing unit connected to the reference node and operable to process an input signal using the local reference voltage signal, wherein the signal processing unit is configured to draw a current from the reference node at least a portion of which is the input signal; and
a current-compensation unit connected to the reference node and operable to apply a compensation current to the reference node,
wherein the current-compensation unit is configured, based on an indicator signal indicative of the input signal or of the operation of the signal processing unit, to control the compensation current to at least partly compensate for changes in the current drawn from the reference node by the signal processing unit due to the input signal, and to control the compensation current only when the input signal or the indicator signal is within a given range of values.

2. The processing circuitry of claim 1, wherein the current-compensation unit is configured, based on the indicator signal, to control the compensation current to at least partly regulate the total current drawn from the reference node by the signal processing unit and the current-compensation unit.

3. The processing circuitry of claim 1, wherein the current-compensation unit is operable to draw the compensation current from, or supply the compensation current to, the reference node.

4. The processing circuitry of claim 1, comprising signal-generation circuitry operable to generate the indicator signal based on the input signal and/or the operation of the signal processing unit.

5. The processing circuitry of claim 1, wherein the current-compensation unit comprises:
one or more capacitors; and
control circuitry operable, in each of a series of operations, to selectively control connection of the capacitors to the reference node so as to control the compensation current.

6. The processing circuitry of claim 5, wherein the control circuitry is operable to refer to a look-up table based on the indicator signal to determine which, if any, of the capacitors to selectively connect to the reference node.

7. The converter circuitry of claim 5, wherein the current-compensation unit further comprises a resistor connected between the reference node and the one or more capacitors to limit a peak value of the compensation current applied to the reference node.

8. The processing circuitry of claim 1, wherein:
the indicator signal is a digital signal whose values are multibit values; and
the current-compensation unit is operable to control the compensation current based on particular bits of the multibit values.

9. The processing circuitry of claim 8, wherein:
the multibit values are generated bit-by-bit; and
current-compensation unit is operable to control the compensation current based on particular bits of the digital signal generated.

10. The processing circuitry of claim 8, wherein the multibit values are generated by:
hard-wired logic; or
constant look-up tables stored in non-volatile memory; or
configurable look-up tables stored in volatile memory.

11. The processing circuitry of claim 1, wherein a portion of the current drawn from the reference node by the signal processing unit is a deterministic current associated with the signal processing unit and independent of the input signal.

12. The processing circuitry of claim 1, wherein the signal processing unit comprises:
- an analogue-to-digital converter; or
- a digital-to-analogue converter; or
- a digital-to-analogue converter of a SAR analogue-to-digital converter; or
- a mixed-signal processing unit; or
- an interleaved analogue-to-digital converter; or
- a pipelined analogue-to-digital converter.

13. The processing circuitry, of claim 1, wherein the signal processing unit and the current-compensation unit are, a unit pair, and wherein the processing circuitry comprises a plurality of the unit pairs connected to a corresponding plurality of said reference nodes, and optionally wherein said plurality of reference nodes are connected to a shared reference node via a distribution network.

14. A current-compensation unit for connection to a reference node along with a signal processing unit, wherein the reference node is for connection to a reference voltage source so as to establish a local reference voltage signal at the reference node, and wherein the signal processing unit when connected to the reference node is operable to process an input signal using the local reference voltage signal, and to draw a current from the reference node at least a portion of which is dependent on the input signal, the current-compensation unit comprising:
- an input unit operable to receive an indicator signal indicative of the input signal and/or of the operation of the signal processing unit; and
- an output unit for connection to the reference node and operable to apply a compensation current to the reference node, wherein the current-compensation unit is configured, based on the indicator signal, to control the compensation current to at least partly compensate for changes in the current drawn from the reference node by the signal processing unit due to the input signal and to control the compensation current only when the input signal or the indicator signal is within a given range of values.

15. Processing circuitry comprising:
- a reference node for connection to a reference voltage source so as to establish a local reference voltage signal at the reference node;
- a signal processing unit connected to the reference node and operable to process an input signal using the local reference voltage signal, wherein the signal processing unit is configured to draw a current from the reference node at least a portion of which is dependent on the input signal; and
- a current-compensation unit connected to the reference node and operable to apply a compensation current to the reference node, wherein the current-compensation unit is configured based on an indicator signal indicative of the input signal and/or of the operation of the signal processing unit, to control the compensation current to at least partly compensate for changes in the current drawn from the reference node by the signal processing unit due to the input signal;

the indicator signal is a digital signal whose values are multibit values that are generated bit-by-bit; and the current-compensation unit is operable to control the compensation current based on particular bits of the multibit values as they are generated.

16. A current-compensation unit for connection to a reference node along with a signal processing unit, wherein the reference node is for connection to a reference voltage source so as to establish a local reference voltage signal at the reference node, and wherein the signal processing unit when connected to the reference node is operable to process an input signal using the local reference voltage signal, and to draw a current from the reference node at least a portion of which is dependent on the input signal, the current-compensation unit comprising:
- an input unit operable to receive an indicator signal indicative of the input signal and/or of the operation of the signal processing unit; and
- an output unit for connection to the reference node and operable to apply a compensation current to the reference node, wherein the current-compensation unit is configured, based on the indicator signal, to control the compensation current to at least partly compensate for changes in the current drawn from the reference node by the signal processing unit due to the input signal;

the indicator signal is a digital signal whose values are multibit values that are generated bit-by-bit; and the current-compensation unit is operable to control the compensation current based on particular bits of the multibit values as they are generated.

* * * * *